(12) United States Patent
Jeon et al.

(10) Patent No.: US 12,419,154 B2
(45) Date of Patent: Sep. 16, 2025

(54) ORGANIC LIGHT EMITTING DIODE DISPLAY DEVICE INCLUDING MULTIPLE EMITTING MATERIAL LAYER AND METHOD OF FABRICATING THE SAME

(71) Applicant: LG DISPLAY CO., LTD., Seoul (KR)

(72) Inventors: Hyun-Sook Jeon, Paju-si (KR);
Moon-Sung Kil, Paju-si (KR);
Eun-Hyung Lee, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 554 days.

(21) Appl. No.: 17/896,535

(22) Filed: Aug. 26, 2022

(65) Prior Publication Data
US 2023/0209853 A1    Jun. 29, 2023

(30) Foreign Application Priority Data
Dec. 28, 2021  (KR) .................. 10-2021-0189866

(51) Int. Cl.
| | | |
|---|---|---|
| *H10K 50/12* | (2023.01) | |
| *H10K 50/11* | (2023.01) | |
| *H10K 50/15* | (2023.01) | |
| *H10K 50/16* | (2023.01) | |
| *H10K 50/17* | (2023.01) | |
| *H10K 59/35* | (2023.01) | |
| *H10K 71/00* | (2023.01) | |
| *H10K 101/10* | (2023.01) | |

(52) U.S. Cl.
CPC ............ *H10K 50/12* (2023.02); *H10K 50/11* (2023.02); *H10K 50/15* (2023.02); *H10K 50/16* (2023.02); *H10K 50/17* (2023.02); *H10K 59/353* (2023.02); *H10K 71/00* (2023.02); *H10K 2101/10* (2023.02)

(58) Field of Classification Search
None
See application file for complete search history.

(56) References Cited

U.S. PATENT DOCUMENTS

| | | | |
|---|---|---|---|
| 2015/0108456 A1* | 4/2015 | Shin ............... | H10K 50/131 257/40 |
| 2019/0006631 A1* | 1/2019 | Kim ............... | H10K 50/131 |
| 2019/0181369 A1* | 6/2019 | You ............... | H10K 50/13 |

(Continued)

FOREIGN PATENT DOCUMENTS

| | | | | |
|---|---|---|---|---|
| CN | 104253240 A | * | 12/2014 | ......... H01L 27/3209 |
| CN | 108023023 B | * | 9/2020 | ......... H01L 27/3211 |

(Continued)

OTHER PUBLICATIONS

Office Action in Korean Appln. No. 10-2021-0189866, mailed on Jun. 13, 2025, 13 pages (with English translation).

*Primary Examiner* — Michael Lebentritt
(74) *Attorney, Agent, or Firm* — Fish & Richardson P.C.

(57) ABSTRACT

An organic light emitting diode display device includes a substrate having a plurality of subpixels; and an emitting material layer in the plurality of subpixels on the substrate, wherein the emitting material layer in at least one of the plurality of subpixels comprises: a first emitting material layer including a first host and a dopant; a second emitting material layer on the first emitting material layer and including a second host and the dopant; and a third emitting material layer on the second emitting material layer and including one of the dopant and the second host.

14 Claims, 13 Drawing Sheets

(56) References Cited

U.S. PATENT DOCUMENTS

| | | | |
|---|---|---|---|
| 2020/0006692 A1* | 1/2020 | Seok | H10K 50/852 |
| 2020/0161580 A1* | 5/2020 | Song | H10K 50/131 |
| 2020/0203649 A1* | 6/2020 | Kwon | H10K 50/82 |
| 2021/0202606 A1* | 7/2021 | Kim | H10K 59/875 |
| 2022/0199929 A1* | 6/2022 | Park | H10K 50/13 |
| 2022/0208888 A1* | 6/2022 | Byeon | H10K 59/353 |
| 2022/0209191 A1* | 6/2022 | Joung | H10K 59/878 |

FOREIGN PATENT DOCUMENTS

| | | | | |
|---|---|---|---|---|
| CN | 112928218 A | * | 6/2021 | H01L 27/322 |
| CN | 109892014 B | * | 7/2021 | G09F 9/30 |
| CN | 113053951 B | * | 5/2024 | H01L 27/3213 |
| EP | 2572391 B1 | * | 11/2020 | H01L 51/5016 |
| EP | 2937915 B1 | * | 6/2022 | H01L 27/3209 |
| KR | 10-0532657 B1 | | 12/2005 | |
| KR | 20120073271 A | | 7/2012 | |
| KR | 20150036872 A | | 4/2015 | |
| KR | 10-2015-0113742 A | | 10/2015 | |
| KR | 20210012482 A | | 2/2021 | |

\* cited by examiner

ORGANIC LIGHT EMITTING DIODE DISPLAY DEVICE INCLUDING MULTIPLE EMITTING MATERIAL LAYER AND METHOD OF FABRICATING THE SAME

CROSS-REFERENCE TO RELATED APPLICATION

The present application claims the priority of Korean Patent Application No. 10-2021-0189866 filed on Dec. 28, 2021, which is hereby incorporated by reference in its entirety.

BACKGROUND

Field of the Disclosure

The present disclosure relates to an organic light emitting diode display device, and more particularly, to an organic light emitting diode display device and a method of fabricating the same where an efficiency is improved by sequentially forming first to third emitting material layers of a host and a dopant using a single chamber.

Description of the Background

Recently, with the advent of an information-oriented society and as the interest in information displays for processing and displaying a massive amount of information and the demand for portable information media have increased, a display field has rapidly advanced. Thus, various light and thin flat panel display devices have been developed and highlighted.

Among the various flat panel display devices, an organic light emitting diode (OLED) display device is an emissive type device and does not include a backlight unit used in a non-emissive type device such as a liquid crystal display (LCD) device. As a result, the OLED display device has advantages in a viewing angle, a contrast ratio and a power consumption to be applied to various fields.

In the OLED display device, an efficiency is improved by forming an emitting material layer as a multiple layer using two hosts. Since the two hosts use two independent chambers, a fabrication process becomes complicated. Further, deterioration is caused by a contamination during a transfer or a misalignment of a fine metal mask.

SUMMARY

Accordingly, the present disclosure is directed to an organic light emitting diode display device and a method of fabricating the same that substantially obviate one or more of the problems due to limitations and disadvantages of the related art.

More specifically, the present disclosure is to provide an organic light emitting display device and a method of fabricating the organic light emitting diode display device where an efficiency is improved and a productivity increases by forming a triple layered emitting material layers of a first emitting material layer of a first host and a dopant, a second emitting material layer of a second host and a dopant and a third emitting material layer of a dopant in a single chamber.

The present disclosure is also to provide an organic light emitting diode display device and a method of fabricating the organic light emitting diode display device where an efficiency is improved and a productivity increases by forming a triple layered emitting material layers of a first emitting material layer of a first host and a dopant, a second emitting material layer of a second host and a dopant and a third emitting material layer of a second host in a single chamber.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting diode display device includes a substrate having a plurality of subpixels; and an emitting material layer in the plurality of subpixels on the substrate, wherein the emitting material layer in at least one of the plurality of subpixels comprises: a first emitting material layer including a first host and a dopant; a second emitting material layer on the first emitting material layer and including a second host and the dopant; and a third emitting material layer on the second emitting material layer and including one of the dopant and the second host.

In another aspect of the present disclosure, a method of fabricating an organic light emitting diode display device includes disposing a substrate in a chamber including a first evaporation source transmitting a first host to a first region, a second evaporation source transmitting a second host to a second region separated from the first region, a third evaporation source transmitting a dopant to a third region corresponding to a sum of the first and second regions and first to third shutters corresponding to the first to third evaporation sources, respectively, the substrate disposed in the first region: forming a first emitting material layer by depositing the first host and the dopant of the first and third evaporation sources on the substrate while the first and third shutters have an open state; transferring the substrate to the second region and forming a second emitting material layer by depositing the second host and the dopant of the second and third evaporation sources on the substrate while the second and third shutters have the open state; and forming a third emitting material layer by depositing the dopant of the third evaporation source on the substrate while the second shutter has a closed state and the third shutter has the open state.

In a further aspect of the present disclosure, a method of fabricating an organic light emitting diode display device includes disposing a substrate in a chamber including a first evaporation source transmitting a first host to a first region, a second evaporation source transmitting a second host to a second region separated from the first region, a third evaporation source transmitting a dopant to a third region corresponding to a sum of the first and second regions and first to third shutters corresponding to the first to third evaporation sources, respectively, the substrate disposed in the first region: forming a first emitting material layer by depositing the first host and the dopant of the first and third evaporation sources on the substrate while the first and third shutters have an open state; transferring the substrate to the second region and forming a second emitting material layer by depositing the second host and the dopant of the second and third evaporation sources on the substrate while the second and third shutters have the open state; and forming a third emitting material layer by depositing the second host of the second evaporation source on the substrate while the second shutter has the open state and the third shutter has a closed state.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
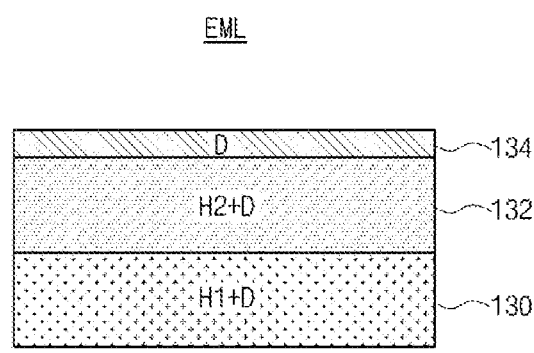
FIG. 1 is a cross-sectional view showing a multiple layered emitting material layer of an organic light emitting diode display device according to a first aspect of the present disclosure.

Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing aspects of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Hereinafter, an organic light emitting diode display device and a method of fabricating the same according to aspects of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

Figure 2:
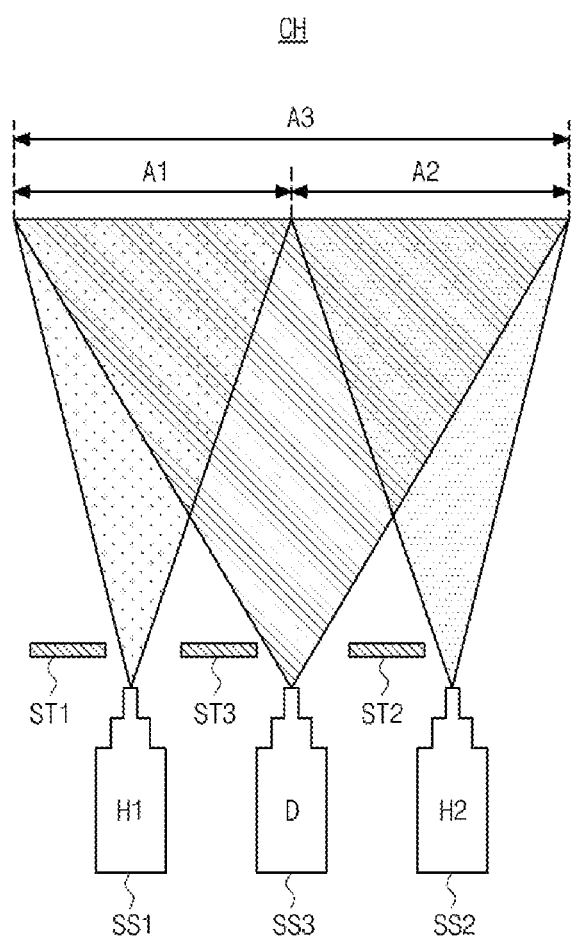
FIG. 2 is a view illustrating a method of fabricating a multiple layered emitting material layer of an organic light emitting diode display device according to a first aspect of the present disclosure.
Figure 3:
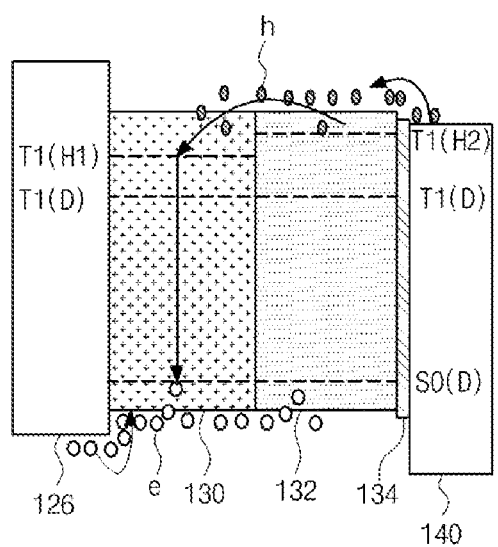
FIG. 3 is an energy band diagram showing a multiple layered emitting material layer of an organic light emitting diode display device according to a first aspect of the present disclosure.

FIG. 1 is a cross-sectional view showing a multiple layered emitting material layer of an organic light emitting diode display device according to a first aspect of the present disclosure, FIG. 2 is a view illustrating a method of fabricating a multiple layered emitting material layer of an organic light emitting diode display device according to a first aspect of the present disclosure, and FIG. 3 is an energy band diagram showing a multiple layered emitting material layer of an organic light emitting diode display device according to a first aspect of the present disclosure.

In FIG. 1, a multiple layered emitting material layer (EML) of an organic light emitting diode (OLED) display device according to a first aspect of the present disclosure includes first, second and third emitting material layers (EMLs) 130, 132 and 134. The first EML 130 includes a first host H1 and a dopant D, the second EML 132 includes a second host H2 and the dopant D, and the third EML 134 includes the dopant D.

A thickness of the first EML 130 is greater than or equal to a thickness of the second EML 132, and a thickness of the third EML 134 is smaller than a thickness of the second EML 132.

For example, the multiple layered EML of the first, second and third EMLs 130, 132 and 134 may be disposed in one of red, green and blue subpixels, and the first, second and third EMLs 130, 132 and 134 may be formed using a single chamber of an evaporation apparatus.

In FIG. 2, a single chamber CH of an evaporation apparatus includes first, second and third evaporation sources SS1, SS2 and SS3 and first, second and third shutters ST1, ST2 and ST3 corresponding to the first, second and third evaporation sources SS1, SS2 and SS3, respectively.

The first evaporation source SS1 transmits the first host H1 to a first region A1, the second evaporation source SS2 transmits the second host H2 to a second region A2, and the third evaporation source SS3 transmits the dopant D to a third region A3.

The first and second regions A1 and A2 do not overlap each other and are separated from each other, and the third region A3 corresponds to a sum of the first and second regions A1 and A2.

In the single chamber CH of the evaporation apparatus, a substrate is disposed in the first region A1, and the first host H1 and the dopant D of the first and third evaporation sources SS1 and SS3 are deposited on the substrate while the first and third shutters ST1 and ST3 have an open state. As a result, the first EML 130 of the first host H1 and the dopant D is formed in a corresponding subpixel on the substrate.

Next, the substrate is transferred to the second region A2, and the second host H2 and the dopant D of the second and third evaporation sources SS2 and SS3 are deposited on the substrate while the second and third shutters ST2 and ST3 have an open state. As a result, the second EML 132 of the second host H2 and the dopant D is formed on the first EML 130.

Next, the substrate is disposed in the second region A2, and the dopant D of the third evaporation sources SS3 are deposited on the substrate while the second shutter ST2 is changed to have a closed state and the third shutter ST3 has the open state. As a result, the third EML 134 of the dopant D is formed on the second EML 132.

In another aspect, the substrate may be transferred to the first region A1, and the dopant D of the third evaporation source SS3 may be deposited on the substrate while the first shutter ST1 is changed to have a closed state and the third shutter ST3 has the open state. As a result, the third EML 134 of the dopant D may be formed on the second EML 132.

In FIG. 3, the first, second and third EMLs 130, 132 and 134 are disposed between an electron blocking layer 126 and a hole blocking layer 140.

An energy level of a lowest unoccupied molecular orbit (LUMO) of the electron blocking layer 126 is higher than an energy level of an LUMO of the first EML 130, and an energy level of a highest occupied molecular orbit (HOMO) of the electron blocking layer 126 is lower than an energy level of a HOMO of the first EML 130.

Energy levels of LUMOs of the first and second EMLs 130 and 132 are the same as each other, and energy levels of HOMOs of the first and second EMLs 130 and 132 are the same as each other.

An energy level of a triplet excited state T1 of the first host H1 of the first EML 130 is lower than an energy level of a triplet excited state T1 of the second host H2 of the second EML 132.

Energy levels of triplet excited states T1 of the dopants of the first and second EMLs 130 and 132 are the same as each other, and energy levels of singlet ground states S0 of the dopants of the first and second EMLs 130 and 132 are the same as each other.

The first and second hosts H1 and H2 of the first and second EMLs 130 and 132 have a bipolar type having a relatively high electron mobility.

The energy level of the LUMO of the third EML 134 is lower than the energy level of the LUMO of the second EML 132 and is higher than the energy level of the LUMO of the hole blocking layer 140. The energy level of the HOMO of the third EML 134 is lower than the energy level of the HOMO of the second EML 132 and is higher than the energy level of the HOMO of the hole blocking layer 140.

The energy level of the LUMO of the third EML 134 has a value between the energy level of the LUMO of the second EML 132 and the energy level of the LUMO of the hole blocking layer 140. The energy level of the HOMO of the third EML 134 has a value between the energy level of the HOMO of the second EML 132 and the energy level of the HOMO of the hole blocking layer 140.

In the multiple layered EML, a hole h of the hole blocking layer 140 is transmitted to the first EML 130 through the third EML 134 and the second EML 132, and an electron e of the electron blocking layer 126 is transmitted to the first EML 130. As a result, a recombination zone of the hole h and the electron e is formed in the first EML 130 to emit a light.

Since the energy level of the LUMO of the dopant D of the third EML 134 has a value between the energy level of the LUMO of the second host H2 and the dopant D of the second EML 132 and the energy level of the LUMO of the hole blocking layer 140, an electron mobility increases and the electron is transmitted to the first EML 130 promptly to improve an emission efficiency.

Further, since the multiple layered EML is formed in the single chamber, the fabrication process is simplified and deterioration due to contamination during transferring or misalignment of a fine metal mask is prevented.

Although the first, second and third EMLs 130, 132 and 134 exemplarily include the same kind of dopant D in the first aspect, the first, second and third EMLs 130, 132 and 134 may include a dopant different from each other in another aspect.

The third EML may include the second host in another aspect, and it will be illustrated with reference to drawings.

Figure 4:
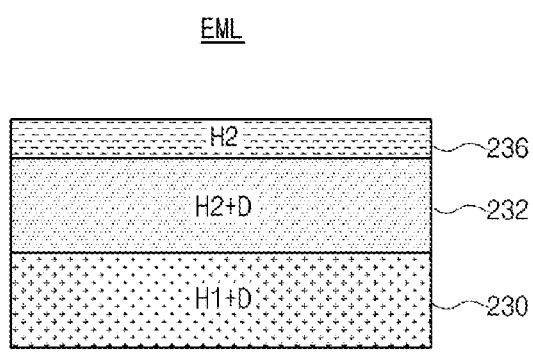
FIG. 4 is a cross-sectional view showing a multiple layered emitting material layer of an organic light emitting diode display device according to a second aspect of the present disclosure.
Figure 5:
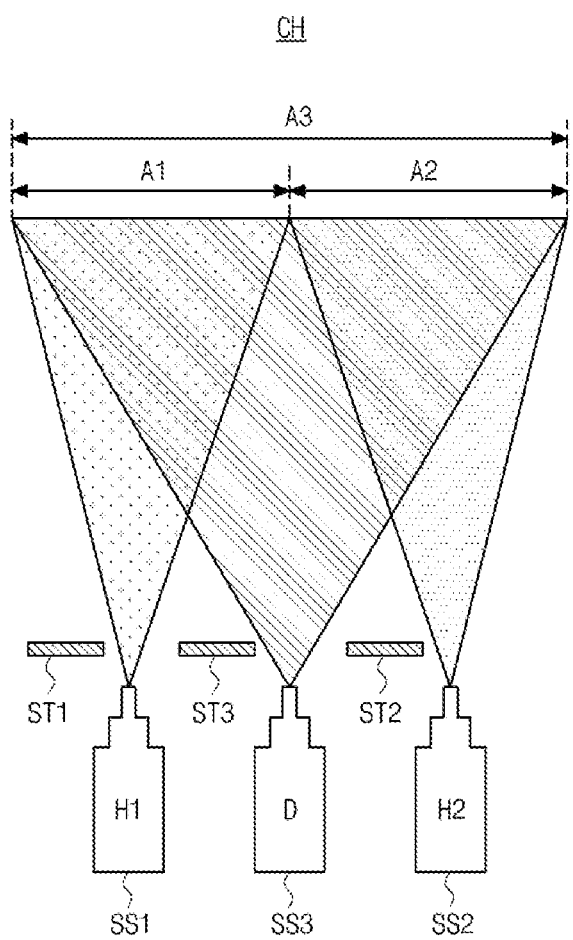
FIG. 5 is a view illustrating a method of fabricating a multiple layered emitting material layer of an organic light emitting diode display device according to a second aspect of the present disclosure.
Figure 6:
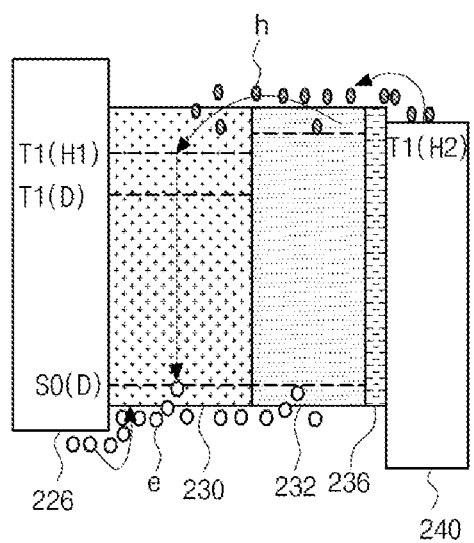
FIG. 6 is an energy band diagram showing a multiple layered emitting material layer of an organic light emitting diode display device according to a second aspect of the present disclosure.

FIG. 4 is a cross-sectional view showing a multiple layered emitting material layer of an organic light emitting diode display device according to a second aspect of the present disclosure, FIG. 5 is a view illustrating a method of fabricating a multiple layered emitting material layer of an organic light emitting diode display device according to a second aspect of the present disclosure, and FIG. 6 is an energy band diagram showing a multiple layered emitting material layer of an organic light emitting diode display device according to a second aspect of the present disclosure.

In FIG. 4, a multiple layered emitting material layer (EML) of an organic light emitting diode (OLED) display device according to a second aspect of the present disclosure includes first, second and third emitting material layers (EMLs) 230, 232 and 236.

A thickness of the first EML 230 is greater than or equal to a thickness of the second EML 232, and a thickness of the third EML 236 is smaller than a thickness of the second EML 232.

For example, the multiple layered EML of the first, second and third EMLs 230, 232 and 236 may be disposed in one of red, green and blue subpixels, and the first, second and third EMLs 230, 232 and 236 may be formed using a single chamber of an evaporation apparatus.

In FIG. 5, a single chamber CH of an evaporation apparatus includes first, second and third evaporation sources SS1, SS2 and SS3 and first, second and third shutters ST1, ST2 and ST3 corresponding to the first, second and third evaporation sources SS1, SS2 and SS3, respectively.

The first evaporation source SS1 transmits the first host H1 to a first region A1, the second evaporation source SS2 transmits the second host H2 to a second region A2, and the third evaporation source SS3 transmits the dopant D to a third region A3.

The first and second regions A1 and A2 do not overlap each other, and the third region A3 corresponds to a sum of the first and second regions A1 and A2.

In the single chamber CH of the evaporation apparatus, a substrate is disposed in the first region A1, and the first host H1 and the dopant D of the first and third evaporation sources SS1 and SS3 are deposited on the substrate while the first and third shutters ST1 and ST3 have an open state. As a result, the first EML 230 of the first host H1 and the dopant D is formed in a corresponding subpixel on the substrate.

Next, the substrate is transferred to the second region A2, and the second host H2 and the dopant D of the second and third evaporation sources SS2 and SS3 are deposited on the substrate while the second and third shutters ST2 and ST3 have an open state. As a result, the second EML 232 of the second host H2 and the dopant D is formed on the first EML 230.

Next, the substrate is disposed in the second region A2, and the second host H2 of the second evaporation sources SS2 is deposited on the substrate while the third shutter ST3 is changed to have a closed state and the second shutter ST2 has an open state. As a result, the third EML 236 of the second host H2 is formed on the second EML 232.

In FIG. 6, the first, second and third EMLs 230, 232 and 236 are disposed between an electron blocking layer 226 and a hole blocking layer 240.

An energy level of a lowest unoccupied molecular orbit (LUMO) of the electron blocking layer 226 is higher than an energy level of an LUMO of the first EML 230, and an energy level of a highest occupied molecular orbit (HOMO) of the electron blocking layer 226 is lower than an energy level of a HOMO of the first EML 230.

Energy levels of LUMOs of the first, second and third EMLs 230, 232 and 236 are the same as each other, and energy levels of HOMOs of the first, second and third EMLs 230, 232 and 236 are the same as each other.

An energy level of a triplet excited state T1 of the first host H1 of the first EML 230 is lower than an energy level of a triplet excited state T1 of the second host H2 of the second EML 232.

Energy levels of triplet excited states T1 of the dopants of the first and second EMLs 230 and 232 are the same as each other, and energy levels of singlet ground states S0 of the dopants of the first and second EMLs 230 and 232 are the same as each other.

The energy level of the LUMO of the third EML 236 is higher than the energy level of the LUMO of the hole blocking layer 240, and the energy level of the HOMO of the third EML 236 is higher than the energy level of the HOMO of the hole blocking layer 240.

The second host H2 of the second and third EMLs 232 and 236 have a bipolar type having a relatively high electron mobility.

In the multiple layered EML, a hole h of the hole blocking layer 240 is transmitted to the first EML 230 through the third EML 236 and the second EML 232, and an electron e of the electron blocking layer 226 is transmitted to the first EML 230. As a result, a recombination zone of the hole h and the electron e is formed in the first EML 230 to emit a light.

Since the second host H2 of the third emitting material layer 236 is formed of a bipolar type material capable of transmitting an exciton with a relatively high electron mobility, the electron mobility is improved and the electron e is promptly transmitted to the first EML 230. As a result, an emission efficiency is improved.

Further, since the multiple layered EML is formed in the single chamber, the fabrication process is simplified and deterioration due to contamination during transferring or misalignment of a fine metal mask is prevented.

Although the first and second EMLs 230 and 232 exemplarily include the same kind of dopant D in the second aspect, the first and second EMLs 230 and 232 may include a dopant different from each other in another aspect.

The multiple layered EML may be disposed in at least one of the red, green and blue subpixels in another aspect, and it will be illustrated with reference to drawings.

Figure 7:
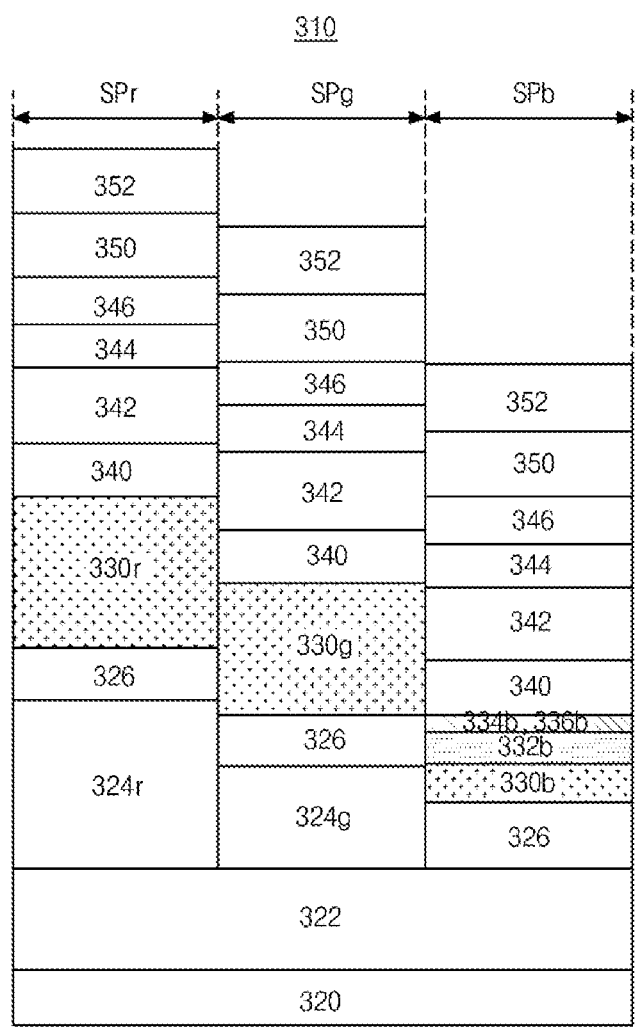
FIG. 7 is a view showing an organic light emitting diode display device according to a third aspect of the present disclosure.

FIG. 7 is a view showing an organic light emitting diode display device according to a third aspect of the present disclosure. A part of the third aspect the same as the first and second aspects will be omitted.

In FIG. 7, an organic light emitting diode (OLED) display device 310 according to a third aspect of the present disclosure includes red, green and blue subpixels SPr, SPg and SPb.

An anode (not shown) is disposed in each of the red, green and blue subpixels SPr, SPg and SPb on a substrate (not shown). A hole injecting layer (HIL) 320 is disposed in a whole of the red, green and blue subpixels SPr, SPg and SPb on the anode, and a hole transporting layer (HTL) 322 is disposed in a whole of the red, green and blue subpixels SPr, SPg and SPb on the HIL 320.

In another aspect, a positive type hole transporting layer (P-HTL) instead of the HIL 320 may be disposed between the anode and the HTL 322.

A red hole transporting layer (HTL) 324r is selectively disposed in the red subpixel SPr on the HTL 322, and a green hole transporting layer (HTL) 324g is selectively disposed in the green subpixel SPg on the HTL 322.

The red HTL 324r and the green HTL 324g may adjust a length of an optical path in the red, green and blue subpixels SPr, SPg and SPb to obtain a micro cavity.

An electron blocking layer (EBL) 326 is disposed on a whole of the red HTL 324r of the red subpixel SPr, the green HTL 324g of the green subpixel SPg and the HTL 322 of the blue subpixel SPb.

A red emitting material layer (EML) 330r is selectively disposed on the EBL 326 of the red subpixel SPr, and a green emitting material layer (EML) 330g is disposed on the EBL 326 of the green subpixel SPg.

A first blue emitting material layer (EML) 330b, a second blue emitting material layer (EML) 332b and a third blue emitting material layer (EML) 334b may be sequentially disposed on the EBL 326 of the blue subpixel SPb, or a first blue emitting material layer (EML) 330b, a second blue emitting material layer (EML) 332b and a third blue emitting material layer (EML) 336b may be sequentially disposed on the EBL 326 of the blue subpixel SPb.

A thickness of the first blue EML 330b is greater than or equal to a thickness of the second blue EML 332b, and a thickness of the third blue EML 334b and 336b is smaller than a thickness of the second blue EML 332b.

A thickness of the green EML 330g is greater than a total thickness of the first blue EML 330b, the second blue EML 332b and the third blue EML 334b or a total thickness of the first blue EML 330b, the second blue EML 332b and the third blue EML 336b and is smaller than a thickness of the red EML 330r.

The first blue EML 330b includes a first blue host and a blue dopant, and the second blue EML 332b includes a second blue host and a blue dopant. The third blue EML 334b includes a blue dopant, and the third blue EML 336b includes a second blue host.

The first blue EML 330b, the second blue EML 332b and the third blue EML 334b may have the same structure as those of the first aspect of FIGS. 1 to 3, and the first blue EML 330b, the second blue EML 332b and the third blue EML 336b may have the same structure as those of the second aspect of FIGS. 4 to 6.

An energy level of a triplet excited state T1 of the first blue host of the first blue EML 330b is lower than an energy level of a triplet excited state T1 of the second blue host of the second blue EML 332b.

An energy level of a lowest unoccupied molecular orbit (LUMO) of the third blue EML 334b has a value between an energy level of a LUMO of the second blue EML 332b and an energy level of a LUMO of the HBL 340, and an energy level of a highest occupied molecular orbit (HOMO) of the third blue EML 334b has a value between an energy level of a HOMO of the second blue EML 332b and an energy level of a HOMO of the HBL 340.

As a result, an electron is promptly transmitted to the first blue EML 330b to improve an emission efficiency.

The second blue host of the third blue EML 336b may include a bipolar type material.

As a result, an electron is promptly transmitted to the first blue EML 330b to improve an emission efficiency.

Further, since the multiple layered EML is formed in the single chamber, the fabrication process is simplified and deterioration due to contamination during transferring or misalignment of a fine metal mask is prevented.

A hole blocking layer (HBL) 340 is disposed on a whole of the red EML 330r of the red subpixel SPr, the green EML 330g of the green subpixel SPg and the third blue EML 334b and 336b of the blue subpixel SPb, and an electron transporting layer (ETL) 342 is disposed on the HBL 340 in the red, green and blue subpixels SPr, SPg and SPb.

First and second cathodes 344 and 346 are sequentially disposed in a whole of the red, green and blue subpixels SPr, SPg and SPb on the ETL 342, and first and second capping layers 350 and 352 are sequentially disposed in a whole of the red, green and blue subpixels SPr, SPg and SPb on the second cathode 346.

Figure 8:
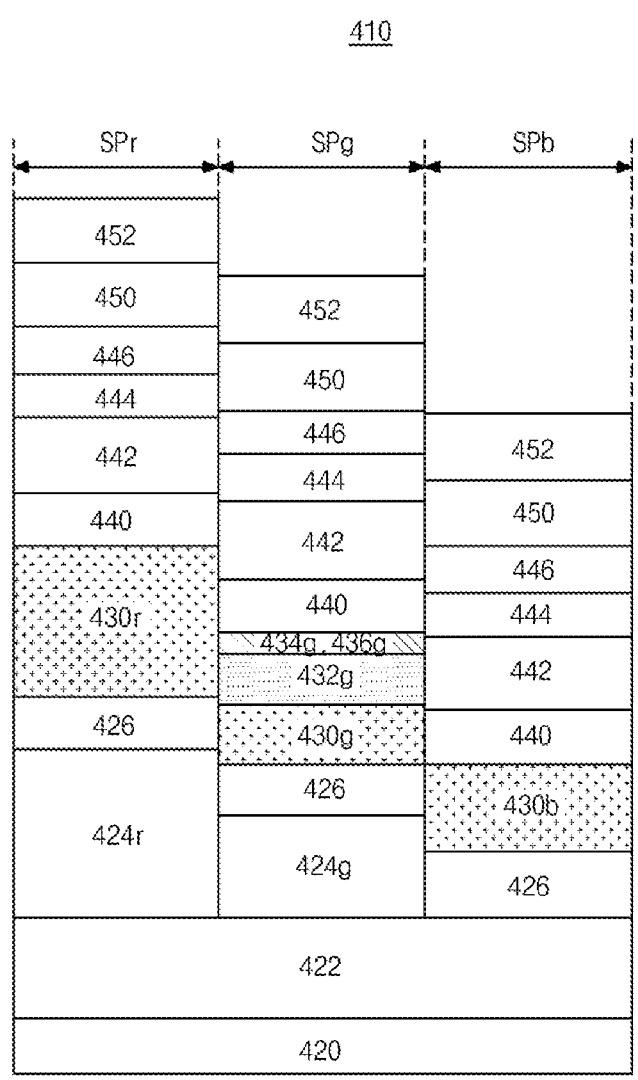
FIG. 8 is a view showing an organic light emitting diode display device according to a fourth aspect of the present disclosure.

FIG. 8 is a view showing an organic light emitting diode display device according to a fourth aspect of the present disclosure. A part of the fourth aspect the same as the first and second aspects will be omitted.

In FIG. 8, an organic light emitting diode (OLED) display device 410 according to a fourth aspect of the present disclosure includes red, green and blue subpixels SPr, SPg and SPb.

An anode (not shown) is disposed in each of the red, green and blue subpixels SPr, SPg and SPb on a substrate (not shown). A hole injecting layer (HIL) 420 is disposed in a whole of the red, green and blue subpixels SPr, SPg and SPb on the anode, and a hole transporting layer (HTL) 422 is disposed in a whole of the red, green and blue subpixels SPr, SPg and SPb on the HIL 420.

In another aspect, a positive type hole transporting layer (P-HTL) instead of the HIL 420 may be disposed between the anode and the HTL 422.

A red hole transporting layer (HTL) 424r is selectively disposed in the red subpixel SPr on the HTL 422, and a green hole transporting layer (HTL) 424g is selectively disposed in the green subpixel SPg on the HTL 422.

The red HTL 424r and the green HTL 424g may adjust a length of an optical path in the red, green and blue subpixels SPr, SPg and SPb to obtain a micro cavity.

An electron blocking layer (EBL) 426 is disposed on a whole of the red HTL 424r of the red subpixel SPr, the green HTL 424g of the green subpixel SPg and the HTL 422 of the blue subpixel SPb.

A red emitting material layer (EML) 430r is selectively disposed on the EBL 426 of the red subpixel SPr, and a blue emitting material layer (EML) 430b is disposed on the EBL 426 of the blue subpixel SPb.

A first green emitting material layer (EML) 430g, a second green emitting material layer (EML) 432g and a third green emitting material layer (EML) 434g may be sequentially disposed on the EBL 426 of the green subpixel SPg, or a first green emitting material layer (EML) 430g, a second green emitting material layer (EML) 432g and a third green emitting material layer (EML) 436g may be sequentially disposed on the EBL 426 of the green subpixel SPg.

A thickness of the first green EML 430g is greater than or equal to a thickness of the second green EML 432g, and a thickness of the third green EML 434g and 436g is smaller than a thickness of the second green EML 432g.

A total thickness of the first green EML 430g, the second green EML 432g and the third green EML 434g or a total thickness of the first green EML 430g, the second green EML 432g and the third green EML 436g is greater than a thickness of the blue EML 430b and is smaller than a thickness of the red EML 430r.

The first green EML 430g includes a first green host and a green dopant, and the second green EML 432g includes a second green host and a green dopant. The third green EML 434g includes a green dopant, and the third green EML 436g includes a second green host.

The first green EML 430g, the second green EML 432g and the third green EML 434g may have the same structure as those of the first aspect of FIGS. 1 to 3, and the first green EML 430g, the second green EML 432g and the third green EML 436g may have the same structure as those of the second aspect of FIGS. 4 to 6.

An energy level of a triplet excited state T1 of the first green host of the first green EML 430g is lower than an energy level of a triplet excited state T1 of the second green host of the second green EML 432g.

An energy level of a lowest unoccupied molecular orbit (LUMO) of the third green EML 434g has a value between an energy level of a LUMO of the second green EML 432g and an energy level of a LUMO of the HBL 440, and an energy level of a highest occupied molecular orbit (HOMO) of the third green EML 434g has a value between an energy level of a HOMO of the second green EML 432g and an energy level of a HOMO of the HBL 440.

As a result, an electron is promptly transmitted to the first green EML 430g to improve an emission efficiency.

The second green host of the third green EML 436g may include a bipolar type material.

As a result, an electron is promptly transmitted to the first green EML 430g to improve an emission efficiency.

Further, since the multiple layered EML is formed in the single chamber, the fabrication process is simplified and deterioration due to contamination during transferring or misalignment of a fine metal mask is prevented.

A hole blocking layer (HBL) 440 is disposed on a whole of the red EML 430r of the red subpixel SPr, the third green EML 434g and 436g of the green subpixel SPg and the blue EML 430b of the blue subpixel SPb, and an electron transporting layer (ETL) 442 is disposed on the HBL 440 in the red, green and blue subpixels SPr, SPg and SPb.

First and second cathodes 444 and 446 are sequentially disposed in a whole of the red, green and blue subpixels SPr, SPg and SPb on the ETL 442, and first and second capping layers 450 and 452 are sequentially disposed in a whole of the red, green and blue subpixels SPr, SPg and SPb on the second cathode 446.

Figure 9:
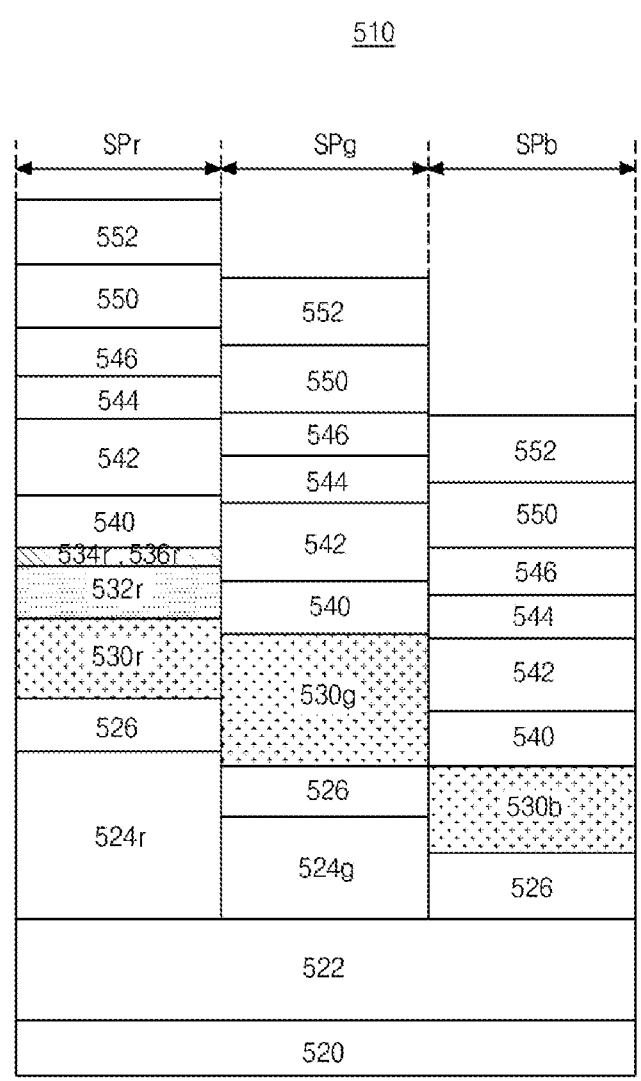
FIG. 9 is a view showing an organic light emitting diode display device according to a fifth aspect of the present disclosure.

FIG. 9 is a view showing an organic light emitting diode display device according to a fifth aspect of the present disclosure. A part of the fifth aspect the same as the first and second aspects will be omitted.

In FIG. 9, an organic light emitting diode (OLED) display device 510 according to a fifth aspect of the present disclosure includes red, green and blue subpixels SPr, SPg and SPb.

An anode (not shown) is disposed in each of the red, green and blue subpixels SPr, SPg and SPb on a substrate (not shown). A hole injecting layer (HIL) 520 is disposed in a whole of the red, green and blue subpixels SPr, SPg and SPb on the anode, and a hole transporting layer (HTL) 522 is disposed in a whole of the red, green and blue subpixels SPr, SPg and SPb on the HIL 520.

In another aspect, a positive type hole transporting layer (P-HTL) instead of the HIL 520 may be disposed between the anode and the HTL 522.

A red hole transporting layer (HTL) 524r is selectively disposed in the red subpixel SPr on the HTL 522, and a green hole transporting layer (HTL) 524g is selectively disposed in the green subpixel SPg on the HTL 522.

The red HTL 524r and the green HTL 524g may adjust a length of an optical path in the red, green and blue subpixels SPr, SPg and SPb to obtain a micro cavity.

An electron blocking layer (EBL) 526 is disposed on a whole of the red HTL 524r of the red subpixel SPr, the green HTL 524g of the green subpixel SPg and the HTL 522 of the blue subpixel SPb.

A first red emitting material layer (EML) 530r, a second red emitting material layer (EML) 532r and a third red emitting material layer (EML) 534r may be sequentially disposed on the EBL 526 of the red subpixel SPr, or a first red emitting material layer (EML) 530r, a second red emitting material layer (EML) 532r and a third red emitting material layer (EML) 536r may be sequentially disposed on the EBL 526 of the red subpixel SPr.

A thickness of the first red EML 530r is greater than or equal to a thickness of the second red EML 532r, and a thickness of the third red EML 534r and 536r is smaller than a thickness of the second red EML 532r.

The green EML 530g is selectively disposed on the EBL 526 of the green subpixel SPg, and the blue EML 530b is selectively disposed on the EBL 526 of the blue subpixel SPb.

A thickness of the green EML 530g is greater than a thickness of the blue EML 530b and is smaller than a total thickness of the first red EML 530r, the second red EML 532r and the third red EML 534r or a total thickness of the first red EML 530r, the second red EML 532r and the third red EML 536r.

The first red EML 530r includes a first red host and a red dopant, and the second red EML 532r includes a second red host and a red dopant. The third red EML 534r includes a red dopant, and the third red EML 536r includes a second red host.

The first red EML 530r, the second red EML 532r and the third red EML 534r may have the same structure as those of the first aspect of FIGS. 1 to 3, and the first red EML 530r, the second red EML 532r and the third red EML 536r may have the same structure as those of the second aspect of FIGS. 4 to 6.

An energy level of a triplet excited state T1 of the first red host of the first red EML 530r is lower than an energy level of a triplet excited state T1 of the second red host of the second red EML 532r.

An energy level of a lowest unoccupied molecular orbit (LUMO) of the third red EML 534r has a value between an energy level of a LUMO of the second red EML 532r and an energy level of a LUMO of the HBL 540, and an energy level of a highest occupied molecular orbit (HOMO) of the third red EML 534r has a value between an energy level of a HOMO of the second red EML 532r and an energy level of a HOMO of the HBL 540.

As a result, an electron is promptly transmitted to the first red EML 530r to improve an emission efficiency.

The second red host of the third red EML 536r may include a bipolar type material.

As a result, an electron is promptly transmitted to the first red EML 530r to improve an emission efficiency.

Further, since the multiple layered EML is formed in the single chamber, the fabrication process is simplified and deterioration due to contamination during transferring or misalignment of a fine metal mask is prevented.

A hole blocking layer (HBL) 540 is disposed on a whole of the third red EML 534r and 536r of the red subpixel SPr, the green EML 530g of the green subpixel SPg and the blue EML 530b of the blue subpixel SPb, and an electron transporting layer (ETL) 542 is disposed on the HBL 540 in the red, green and blue subpixels SPr, SPg and SPb.

First and second cathodes 544 and 546 are sequentially disposed in a whole of the red, green and blue subpixels SPr, SPg and SPb on the ETL 542, and first and second capping layers 550 and 552 are sequentially disposed in a whole of the red, green and blue subpixels SPr, SPg and SPb on the second cathode 546.

Figure 10:
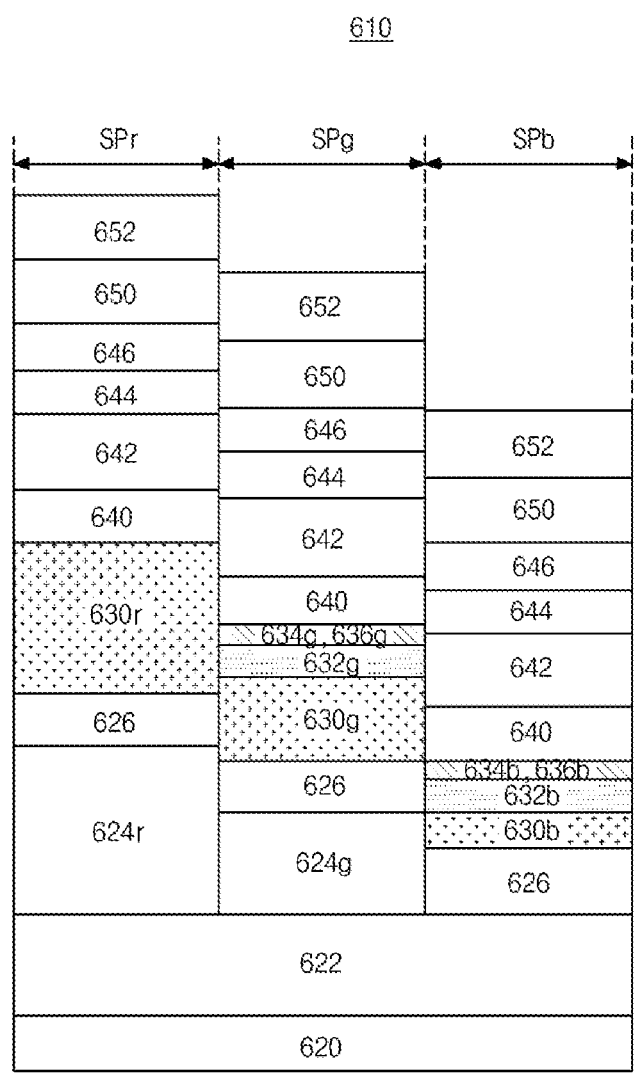
FIG. 10 is a view showing an organic light emitting diode display device according to a sixth aspect of the present disclosure.

FIG. 10 is a view showing an organic light emitting diode display device according to a sixth aspect of the present disclosure. A part of the sixth aspect the same as the first and second aspects will be omitted.

In FIG. 10, an organic light emitting diode (OLED) display device 610 according to a sixth aspect of the present disclosure includes red, green and blue subpixels SPr, SPg and SPb.

An anode (not shown) is disposed in each of the red, green and blue subpixels SPr, SPg and SPb on a substrate (not shown). A hole injecting layer (HIL) 620 is disposed in a whole of the red, green and blue subpixels SPr, SPg and SPb on the anode, and a hole transporting layer (HTL) 622 is disposed in a whole of the red, green and blue subpixels SPr, SPg and SPb on the HIL 620.

In another aspect, a positive type hole transporting layer (P-HTL) instead of the HIL 620 may be disposed between the anode and the HTL 622.

A red hole transporting layer (HTL) 624r is selectively disposed in the red subpixel SPr on the HTL 622, and a green hole transporting layer (HTL) 624g is selectively disposed in the green subpixel SPg on the HTL 622.

The red HTL 624r and the green HTL 624g may adjust a length of an optical path in the red, green and blue subpixels SPr, SPg and SPb to obtain a micro cavity.

An electron blocking layer (EBL) 626 is disposed on a whole of the red HTL 624r of the red subpixel SPr, the green HTL 624g of the green subpixel SPg and the HTL 622 of the blue subpixel SPb.

A red emitting material layer (EML) 630r is selectively disposed on the EBL 626 of the red subpixel SPr.

A first green emitting material layer (EML) 630g, a second green emitting material layer (EML) 632g and a third green emitting material layer (EML) 634g may be sequentially disposed on the EBL 626 of the green subpixel SPg, or a first green emitting material layer (EML) 630g, a second green emitting material layer (EML) 632g and a third green emitting material layer (EML) 636g may be sequentially disposed on the EBL 626 of the green subpixel SPg.

A thickness of the first green EML 630g is greater than or equal to a thickness of the second green EML 632g, and a thickness of the third green EML 634g and 636g is smaller than a thickness of the second green EML 632g.

A first blue emitting material layer (EML) 630b, a second blue emitting material layer (EML) 632b and a third blue emitting material layer (EML) 634b may be sequentially disposed on the EBL 626 of the blue subpixel SPb, or a first blue emitting material layer (EML) 630b, a second blue emitting material layer (EML) 632b and a third blue emitting material layer (EML) 636b may be sequentially disposed on the EBL 626 of the blue subpixel SPb.

A thickness of the first blue EML 630b is greater than or equal to a thickness of the second blue EML 632b, and a thickness of the third blue EML 634b and 636b is smaller than a thickness of the second blue EML 632b.

A total thickness of the first green EML 630g, the second green EML 632g and the third green EML 634g or a total thickness of the first green EML 630g, the second green EML 632g and the third green EML 636g is greater than a total thickness of the first blue EML 630b, the second blue EML 632b and the third blue EML 634b or a total thickness of the first blue EML 630b, the second blue EML 632b and the third blue EML 636b and is smaller than a thickness of the red EML 630r.

The first green EML 630g includes a first green host and a green dopant, and the second green EML 632g includes a second green host and a green dopant. The third green EML 634g includes a green dopant, and the third green EML 636g includes a second green host.

The first blue EML 630b includes a first blue host and a blue dopant, and the second blue EML 632b includes a second blue host and a blue dopant. The third blue EML 634b includes a blue dopant, and the third blue EML 636b includes a second blue host.

The first green EML 630g, the second green EML 632g and the third green EML 634g may have the same structure as those of the first aspect of FIGS. 1 to 3, and the first green EML 630g, the second green EML 632g and the third green EML 636g may have the same structure as those of the second aspect of FIGS. 4 to 6.

The first blue EML 630b, the second blue EML 632b and the third blue EML 634b may have the same structure as those of the first aspect of FIGS. 1 to 3, and the first blue EML 630b, the second blue EML 632b and the third blue EML 636b may have the same structure as those of the second aspect of FIGS. 4 to 6.

An energy level of a triplet excited state T1 of the first green host of the first green EML 630g is lower than an energy level of a triplet excited state T1 of the second green host of the second green EML 632g.

An energy level of a triplet excited state T1 of the first blue host of the first blue EML 630b is lower than an energy level of a triplet excited state T1 of the second blue host of the second blue EML 632b.

An energy level of a lowest unoccupied molecular orbit (LUMO) of the third green EML 634g has a value between an energy level of a LUMO of the second green EML 632g and an energy level of a LUMO of the HBL 640, and an energy level of a highest occupied molecular orbit (HOMO) of the third green EML 634g has a value between an energy level of a HOMO of the second green EML 632g and an energy level of a HOMO of the HBL 640.

An energy level of a lowest unoccupied molecular orbit (LUMO) of the third blue EML 634b has a value between an energy level of a LUMO of the second blue EML 632b and an energy level of a LUMO of the HBL 640, and an energy level of a highest occupied molecular orbit (HOMO) of the third blue EML 634b has a value between an energy level of a HOMO of the second blue EML 632b and an energy level of a HOMO of the HBL 640.

As a result, an electron is promptly transmitted to the first green EML 630g and the first blue EML 630b to improve an emission efficiency.

The second green host of the third green EML 636g and the second blue host of the third blue EML 636b may include a bipolar type material.

As a result, an electron is promptly transmitted to the first green EML 630g and the first blue EML 630b to improve an emission efficiency.

Further, since the multiple layered EML is formed in the single chamber, the fabrication process is simplified and deterioration due to contamination during transferring or misalignment of a fine metal mask is prevented.

A hole blocking layer (HBL) 640 is disposed on a whole of the red EML 630r of the red subpixel SPr, the third green EML 634g and 636g of the green subpixel SPg and the third blue EML 634b and 636b of the blue subpixel SPb, and an electron transporting layer (ETL) 642 is disposed on the HBL 640 in the red, green and blue subpixels SPr, SPg and SPb.

First and second cathodes 644 and 646 are sequentially disposed in a whole of the red, green and blue subpixels SPr, SPg and SPb on the ETL 642, and first and second capping layers 650 and 652 are sequentially disposed in a whole of the red, green and blue subpixels SPr, SPg and SPb on the second cathode 646.

Figure 11:
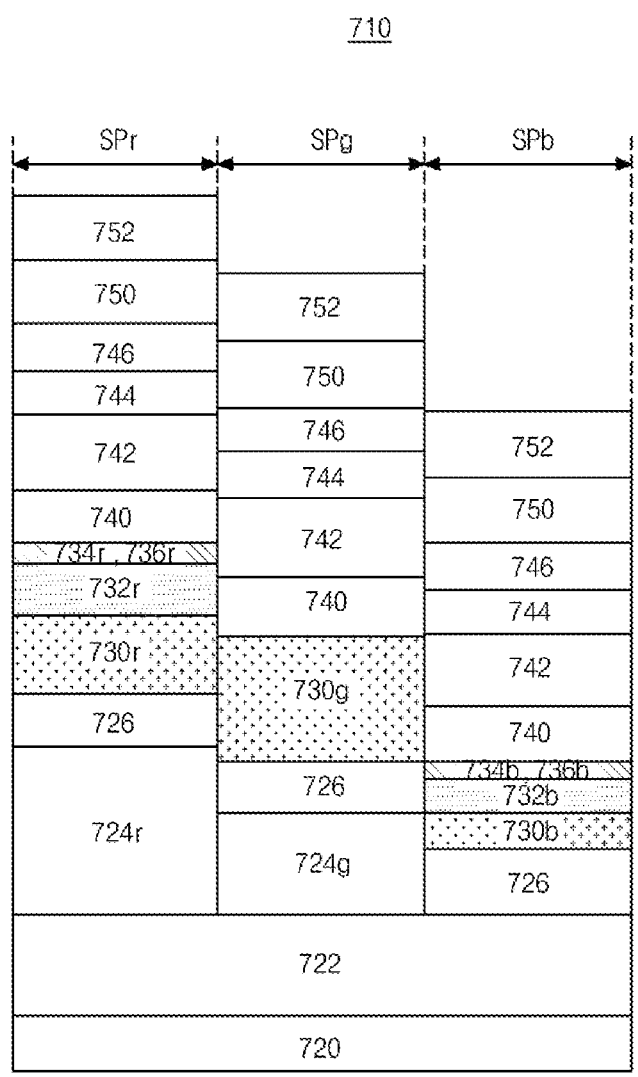
FIG. 11 is a view showing an organic light emitting diode display device according to a seventh aspect of the present disclosure.

FIG. 11 is a view showing an organic light emitting diode display device according to a seventh aspect of the present disclosure. A part of the seventh aspect the same as the first and second aspects will be omitted.

In FIG. 11, an organic light emitting diode (OLED) display device 710 according to a seventh aspect of the present disclosure includes red, green and blue subpixels SPr, SPg and SPb.

An anode (not shown) is disposed in each of the red, green and blue subpixels SPr, SPg and SPb on a substrate (not shown). A hole injecting layer (HIL) 720 is disposed in a whole of the red, green and blue subpixels SPr, SPg and SPb on the anode, and a hole transporting layer (HTL) 722 is disposed in a whole of the red, green and blue subpixels SPr, SPg and SPb on the HIL 720.

In another aspect, a positive type hole transporting layer (P-HTL) instead of the HIL 720 may be disposed between the anode and the HTL 722.

A red hole transporting layer (HTL) 724r is selectively disposed in the red subpixel SPr on the HTL 722, and a green hole transporting layer (HTL) 724g is selectively disposed in the green subpixel SPg on the HTL 722.

The red HTL 724r and the green HTL 724g may adjust a length of an optical path in the red, green and blue subpixels SPr, SPg and SPb to obtain a micro cavity.

An electron blocking layer (EBL) 726 is disposed on a whole of the red HTL 724r of the red subpixel SPr, the green HTL 724g of the green subpixel SPg and the HTL 722 of the blue subpixel SPb.

A first red emitting material layer (EML) 730r, a second red emitting material layer (EML) 732r and a third red emitting material layer (EML) 734r may be sequentially disposed on the EBL 726 of the red subpixel SPr, or a first red emitting material layer (EML) 730r, a second red emitting material layer (EML) 732r and a third red emitting material layer (EML) 736r may be sequentially disposed on the EBL 726 of the red subpixel SPr.

A thickness of the first red EML 730r is greater than or equal to a thickness of the second red EML 732r, and a thickness of the third red EML 734r and 736r is smaller than a thickness of the second red EML 732r.

The green EML 730g is selectively disposed on the EBL 726 of the green subpixel SPg.

A first blue emitting material layer (EML) 730b, a second blue emitting material layer (EML) 732b and a third blue emitting material layer (EML) 734b may be sequentially disposed on the EBL 726 of the blue subpixel SPb, or a first blue emitting material layer (EML) 730b, a second blue emitting material layer (EML) 732b and a third blue emitting material layer (EML) 736b may be sequentially disposed on the EBL 726 of the blue subpixel SPb.

A thickness of the first blue EML 730b is greater than or equal to a thickness of the second blue EML 732b, and a thickness of the third blue EML 734b and 736b is smaller than a thickness of the second blue EML 732b.

A thickness of the green EML 730g is greater than a total thickness of the first blue EML 730b, the second blue EML 732b and the third blue EML 734b or a total thickness of the first blue EML 730b, the second blue EML 732b and the third blue EML 736b and is smaller than a total thickness of the first red EML 730r, the second red EML 732r and the third red EML 734r or a total thickness of the first red EML 730r, the second red EML 732r and the third red EML 736r.

The first red EML 730r includes a first red host and a red dopant, and the second red EML 732r includes a second red host and a red dopant. The third red EML 734r includes a red dopant, and the third red EML 736r includes a second red host.

The first blue EML 730b includes a first blue host and a blue dopant, and the second blue EML 732b includes a second blue host and a blue dopant. The third blue EML 734b includes a blue dopant, and the third blue EML 736b includes a second blue host.

The first red EML 730r, the second red EML 732r and the third red EML 734r may have the same structure as those of the first aspect of FIGS. 1 to 3, and the first red EML 730r, the second red EML 732r and the third red EML 736r may have the same structure as those of the second aspect of FIGS. 4 to 6.

The first blue EML 730b, the second blue EML 732b and the third blue EML 734b may have the same structure as those of the first aspect of FIGS. 1 to 3, and the first blue EML 730b, the second blue EML 732b and the third blue EML 736b may have the same structure as those of the second aspect of FIGS. 4 to 6.

An energy level of a triplet excited state T1 of the first red host of the first red EML 730r is lower than an energy level of a triplet excited state T1 of the second red host of the second red EML 732r.

An energy level of a triplet excited state T1 of the first blue host of the first blue EML 730b is lower than an energy level of a triplet excited state T1 of the second blue host of the second blue EML 732b.

An energy level of a lowest unoccupied molecular orbit (LUMO) of the third red EML 734r has a value between an energy level of a LUMO of the second red EML 732r and an energy level of a LUMO of the HBL 740, and an energy level of a highest occupied molecular orbit (HOMO) of the third red EML 734r has a value between an energy level of a HOMO of the second red EML 732r and an energy level of a HOMO of the HBL 740.

An energy level of a lowest unoccupied molecular orbit (LUMO) of the third blue EML 734b has a value between an energy level of a LUMO of the second blue EML 732b and an energy level of a LUMO of the HBL 740, and an energy level of a highest occupied molecular orbit (HOMO) of the third blue EML 734b has a value between an energy level of a HOMO of the second blue EML 732b and an energy level of a HOMO of the HBL 740.

As a result, an electron is promptly transmitted to the first red EML 730r and the first blue EML 730b to improve an emission efficiency.

The second red host of the third red EML 736r and the second blue host of the third blue EML 736b may include a bipolar type material.

As a result, an electron is promptly transmitted to the first red EML 730r and the first blue EML 730b to improve an emission efficiency.

Further, since the multiple layered EML is formed in the single chamber, the fabrication process is simplified and deterioration due to contamination during transferring or misalignment of a fine metal mask is prevented.

A hole blocking layer (HBL) 740 is disposed on a whole of the third red EML 734r and 736r of the red subpixel SPr, the green EML 730g of the green subpixel SPg and the third blue EML 734b and 736b of the blue subpixel SPb, and an electron transporting layer (ETL) 742 is disposed on the HBL 740 in the red, green and blue subpixels SPr, SPg and SPb.

First and second cathodes 744 and 746 are sequentially disposed in a whole of the red, green and blue subpixels SPr, SPg and SPb on the ETL 742, and first and second capping layers 750 and 752 are sequentially disposed in a whole of the red, green and blue subpixels SPr, SPg and SPb on the second cathode 746.

Figure 12:
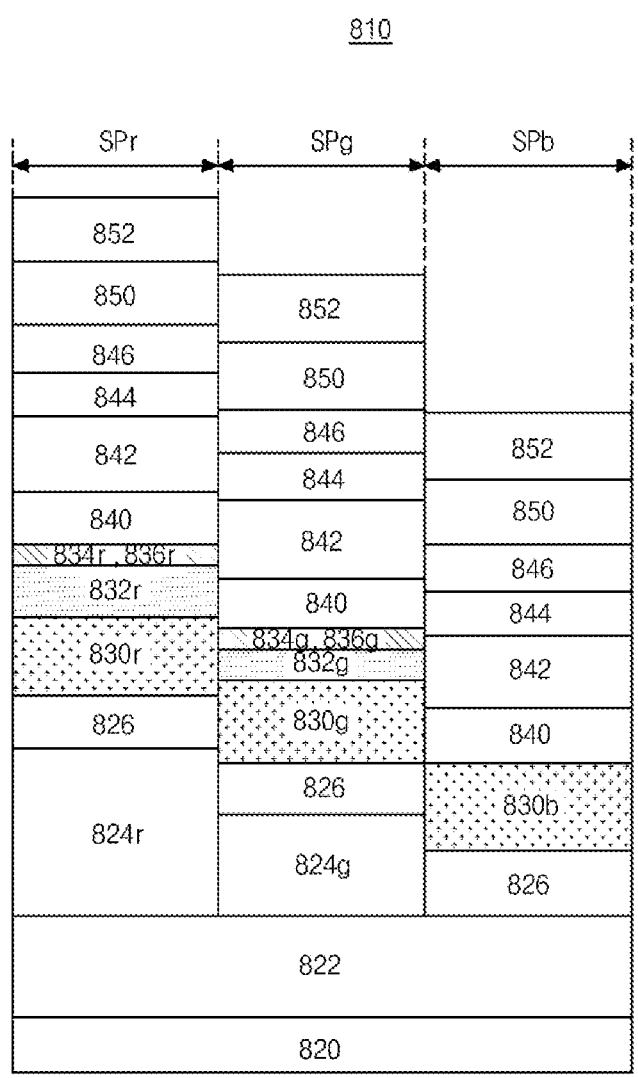
FIG. 12 is a view showing an organic light emitting diode display device according to an eighth aspect of the present disclosure.

FIG. 12 is a view showing an organic light emitting diode display device according to an eighth aspect of the present disclosure. A part of the eighth aspect the same as the first and second aspects will be omitted.

In FIG. 12, an organic light emitting diode (OLED) display device 810 according to an eighth aspect of the present disclosure includes red, green and blue subpixels SPr, SPg and SPb.

An anode (not shown) is disposed in each of the red, green and blue subpixels SPr, SPg and SPb on a substrate (not shown). A hole injecting layer (HIL) 820 is disposed in a whole of the red, green and blue subpixels SPr, SPg and SPb on the anode, and a hole transporting layer (HTL) 822 is disposed in a whole of the red, green and blue subpixels SPr, SPg and SPb on the HIL 820.

In another aspect, a positive type hole transporting layer (P-HTL) instead of the HIL 820 may be disposed between the anode and the HTL 822.

A red hole transporting layer (HTL) 824r is selectively disposed in the red subpixel SPr on the HTL 822, and a green hole transporting layer (HTL) 824g is selectively disposed in the green subpixel SPg on the HTL 822.

The red HTL 824r and the green HTL 824g may adjust a length of an optical path in the red, green and blue subpixels SPr, SPg and SPb to obtain a micro cavity.

An electron blocking layer (EBL) 826 is disposed on a whole of the red HTL 824r of the red subpixel SPr, the green HTL 824g of the green subpixel SPg and the HTL 822 of the blue subpixel SPb.

A first red emitting material layer (EML) 830r, a second red emitting material layer (EML) 832r and a third red emitting material layer (EML) 834r may be sequentially disposed on the EBL 826 of the red subpixel SPr, or a first red emitting material layer (EML) 830r, a second red emitting material layer (EML) 832r and a third red emitting material layer (EML) 836r may be sequentially disposed on the EBL 826 of the red subpixel SPr.

A thickness of the first red EML 830r is greater than or equal to a thickness of the second red EML 832r, and a thickness of the third red EML 834r and 836r is smaller than a thickness of the second red EML 832r.

A first green emitting material layer (EML) 830g, a second green emitting material layer (EML) 832g and a third green emitting material layer (EML) 834g may be sequentially disposed on the EBL 826 of the green subpixel SPg, or a first green emitting material layer (EML) 830g, a second green emitting material layer (EML) 832g and a third green emitting material layer (EML) 836g may be sequentially disposed on the EBL 826 of the green subpixel SPg.

A thickness of the first green EML 830g is greater than or equal to a thickness of the second green EML 832g, and a thickness of the third green EML 834g and 836g is smaller than a thickness of the second green EML 832g.

The blue EML 830b is selectively disposed on the EBL 826 of the blue subpixel SPb.

A total thickness of the first green EML 830g, the second green EML 832g and the third green EML 834g or a total thickness of the first green EML 830g, the second green EML 832g and the third green EML 836g is greater than a thickness of the blue EML 830b and is smaller than a total thickness of the first red EML 830r, the second red EML 832r and the third red EML 834r or a total thickness of the first red EML 830b, the second red EML 832r and the third red EML 836r.

The first red EML 830r includes a first red host and a red dopant, and the second red EML 832r includes a second red host and a red dopant. The third red EML 834r includes a red dopant, and the third red EML 836r includes a second red host.

The first green EML 830g includes a first green host and a green dopant, and the second green EML 832g includes a second green host and a green dopant. The third green EML 834g includes a green dopant, and the third green EML 836g includes a second green host.

The first red EML 830r, the second red EML 832r and the third red EML 834r may have the same structure as those of the first aspect of FIGS. 1 to 3, and the first red EML 830r, the second red EML 832r and the third red EML 836r may have the same structure as those of the second aspect of FIGS. 4 to 6.

The first green EML 830g, the second green EML 832g and the third green EML 834g may have the same structure as those of the first aspect of FIGS. 1 to 3, and the first green EML 830g, the second green EML 832g and the third green EML 836g may have the same structure as those of the second aspect of FIGS. 4 to 6.

An energy level of a triplet excited state T1 of the first red host of the first red EML 830r is lower than an energy level of a triplet excited state T1 of the second red host of the second red EML 832r.

An energy level of a triplet excited state T1 of the first green host of the first green EML 830g is lower than an energy level of a triplet excited state T1 of the second green host of the second green EML 832g.

An energy level of a lowest unoccupied molecular orbit (LUMO) of the third red EML 834r has a value between an energy level of a LUMO of the second red EML 832r and an energy level of a LUMO of the HBL 840, and an energy level of a highest occupied molecular orbit (HOMO) of the third red EML 834r has a value between an energy level of a HOMO of the second red EML 832r and an energy level of a HOMO of the HBL 840.

An energy level of a lowest unoccupied molecular orbit (LUMO) of the third green EML 834g has a value between an energy level of a LUMO of the second green EML 832g and an energy level of a LUMO of the HBL 840, and an energy level of a highest occupied molecular orbit (HOMO) of the third green EML 834g has a value between an energy level of a HOMO of the second green EML 832g and an energy level of a HOMO of the HBL 840.

As a result, an electron is promptly transmitted to the first red EML 830r and the first green EML 830g to improve an emission efficiency.

The second red host of the third red EML 836r and the second green host of the third green EML 836g may include a bipolar type material.

As a result, an electron is promptly transmitted to the first red EML 830r and the first green EML 830g to improve an emission efficiency.

Further, since the multiple layered EML is formed in the single chamber, the fabrication process is simplified and deterioration due to contamination during transferring or misalignment of a fine metal mask is prevented.

A hole blocking layer (HBL) 840 is disposed on a whole of the third red EML 834r and 836r of the red subpixel SPr, the third green EML 834g and 836g of the green subpixel SPg and the blue EML 830b of the blue subpixel SPb, and an electron transporting layer (ETL) 842 is disposed on the HBL 840 in the red, green and blue subpixels SPr, SPg and SPb.

First and second cathodes 844 and 846 are sequentially disposed in a whole of the red, green and blue subpixels SPr, SPg and SPb on the ETL 842, and first and second capping layers 850 and 852 are sequentially disposed in a whole of the red, green and blue subpixels SPr, SPg and SPb on the second cathode 846.

Figure 13:
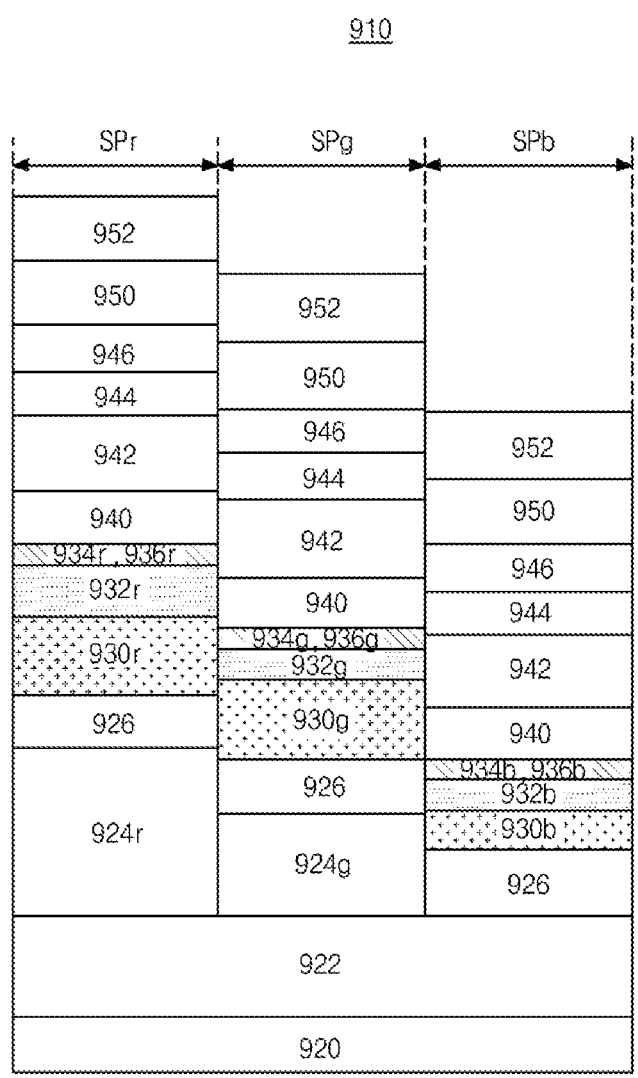
FIG. 13 is a view showing an organic light emitting diode display device according to a ninth aspect of the present disclosure.

FIG. 13 is a view showing an organic light emitting diode display device according to a ninth aspect of the present disclosure. A part of the ninth aspect the same as the first and second aspects will be omitted.

In FIG. 13, an organic light emitting diode (OLED) display device 910 according to a ninth aspect of the present disclosure includes red, green and blue subpixels SPr, SPg and SPb.

An anode (not shown) is disposed in each of the red, green and blue subpixels SPr, SPg and SPb on a substrate (not shown). A hole injecting layer (HIL) 920 is disposed in a whole of the red, green and blue subpixels SPr, SPg and SPb on the anode, and a hole transporting layer (HTL) 922 is disposed in a whole of the red, green and blue subpixels SPr, SPg and SPb on the HIL 920.

In another aspect, a positive type hole transporting layer (P-HTL) instead of the HIL 920 may be disposed between the anode and the HTL 922.

A red hole transporting layer (HTL) 924r is selectively disposed in the red subpixel SPr on the HTL 922, and a green hole transporting layer (HTL) 924g is selectively disposed in the green subpixel SPg on the HTL 922.

The red HTL 924r and the green HTL 924g may adjust a length of an optical path in the red, green and blue subpixels SPr, SPg and SPb to obtain a micro cavity.

An electron blocking layer (EBL) 926 is disposed on a whole of the red HTL 924r of the red subpixel SPr, the green HTL 924g of the green subpixel SPg and the HTL 922 of the blue subpixel SPb.

A first red emitting material layer (EML) 930r, a second red emitting material layer (EML) 932r and a third red emitting material layer (EML) 934r may be sequentially disposed on the EBL 926 of the red subpixel SPr, or a first red emitting material layer (EML) 930r, a second red emitting material layer (EML) 932r and a third red emitting material layer (EML) 936r may be sequentially disposed on the EBL 926 of the red subpixel SPr.

A thickness of the first red EML 930r is greater than or equal to a thickness of the second red EML 932r, and a thickness of the third red EML 934r and 936r is smaller than a thickness of the second red EML 932r.

A first green emitting material layer (EML) 930g, a second green emitting material layer (EML) 932g and a third green emitting material layer (EML) 934g may be sequentially disposed on the EBL 926 of the green subpixel SPg, or a first green emitting material layer (EML) 930g, a second green emitting material layer (EML) 932g and a third green emitting material layer (EML) 936g may be sequentially disposed on the EBL 926 of the green subpixel SPg.

A thickness of the first green EML 930g is greater than or equal to a thickness of the second green EML 932g, and a thickness of the third green EML 934g and 936g is smaller than a thickness of the second green EML 932g.

A first blue emitting material layer (EML) 930b, a second blue emitting material layer (EML) 932b and a third blue emitting material layer (EML) 934b may be sequentially disposed on the EBL 926 of the blue subpixel SPb, or a first blue emitting material layer (EML) 930b, a second blue emitting material layer (EML) 932b and a third blue emitting material layer (EML) 936b may be sequentially disposed on the EBL 926 of the blue subpixel SPb.

A thickness of the first blue EML 930b is greater than or equal to a thickness of the second blue EML 932b, and a thickness of the third blue EML 934b and 936b is smaller than a thickness of the second blue EML 932b.

A total thickness of the first green EML 930g, the second green EML 932g and the third green EML 934g or a total thickness of the first green EML 930g, the second green EML 932g and the third green EML 936g is greater than a total thickness of the first blue EML 930b, the second blue EML 932b and the third blue EML 934b or a total thickness of the first blue EML 930b, the second blue EML 932b and the third blue EML 936b and is smaller than a total thickness of the first red EML 930r, the second red EML 932r and the third red EML 934r or a total thickness of the first red EML 930b, the second red EML 932r and the third red EML 936r.

The first red EML 930r includes a first red host and a red dopant, and the second red EML 932r includes a second red host and a red dopant. The third red EML 934r includes a red dopant, and the third red EML 936r includes a second red host.

The first green EML 930g includes a first green host and a green dopant, and the second green EML 932g includes a second green host and a green dopant. The third green EML 934g includes a green dopant, and the third green EML 936g includes a second green host.

The first blue EML 930b includes a first blue host and a blue dopant, and the second blue EML 932b includes a second blue host and a blue dopant. The third blue EML 934b includes a blue dopant, and the third blue EML 936b includes a second blue host.

The first red EML 930r, the second red EML 932r and the third red EML 934r may have the same structure as those of the first aspect of FIGS. 1 to 3, and the first red EML 930r, the second red EML 932r and the third red EML 936r may have the same structure as those of the second aspect of FIGS. 4 to 6.

The first green EML 930g, the second green EML 932g and the third green EML 934g may have the same structure as those of the first aspect of FIGS. 1 to 3, and the first green EML 930g, the second green EML 932g and the third green EML 936g may have the same structure as those of the second aspect of FIGS. 4 to 6.

The first blue EML 930b, the second blue EML 932b and the third blue EML 934b may have the same structure as those of the first aspect of FIGS. 1 to 3, and the first blue EML 930b, the second blue EML 932b and the third blue EML 936b may have the same structure as those of the second aspect of FIGS. 4 to 6.

An energy level of a triplet excited state T1 of the first red host of the first red EML 930r is lower than an energy level of a triplet excited state T1 of the second red host of the second red EML 932r.

An energy level of a triplet excited state T1 of the first green host of the first green EML 930g is lower than an energy level of a triplet excited state T1 of the second green host of the second green EML 932g.

An energy level of a triplet excited state T1 of the first blue host of the first blue EML 930b is lower than an energy level of a triplet excited state T1 of the second blue host of the second blue EML 932b.

An energy level of a lowest unoccupied molecular orbit (LUMO) of the third red EML 934r has a value between an energy level of a LUMO of the second red EML 932r and an energy level of a LUMO of the HBL 940, and an energy level of a highest occupied molecular orbit (HOMO) of the third red EML 934r has a value between an energy level of a HOMO of the second red EML 932r and an energy level of a HOMO of the HBL 940.

An energy level of a lowest unoccupied molecular orbit (LUMO) of the third green EML 934g has a value between an energy level of a LUMO of the second green EML 932g and an energy level of a LUMO of the HBL 940, and an energy level of a highest occupied molecular orbit (HOMO) of the third green EML 934g has a value between an energy level of a HOMO of the second green EML 932g and an energy level of a HOMO of the HBL 940.

An energy level of a lowest unoccupied molecular orbit (LUMO) of the third blue EML 934b has a value between an energy level of a LUMO of the second blue EML 932b and an energy level of a LUMO of the HBL 940, and an energy level of a highest occupied molecular orbit (HOMO) of the third blue EML 934b has a value between an energy level of a HOMO of the second blue EML 932b and an energy level of a HOMO of the HBL 940.

As a result, an electron is promptly transmitted to the first red EML 930r, the first green EML 930g and the first blue EML 930b to improve an emission efficiency.

The second red host of the third red EML 936r, the second green host of the third green EML 936g and the second blue host of the third blue EML 936b may include a bipolar type material.

As a result, an electron is promptly transmitted to the first red EML 930r, the first green EML 930g and the first blue EML 930b to improve an emission efficiency.

Further, since the multiple layered EML is formed in the single chamber, the fabrication process is simplified and deterioration due to contamination during transferring or misalignment of a fine metal mask is prevented.

A hole blocking layer (HBL) 940 is disposed on a whole of the third red EML 934r and 936r of the red subpixel SPr, the third green EML 934g and 936g of the green subpixel SPg and the third blue EML 934b and 936b of the blue subpixel SPb, and an electron transporting layer (ETL) 942 is disposed on the HBL 940 in the red, green and blue subpixels SPr, SPg and SPb.

First and second cathodes 944 and 946 are sequentially disposed in a whole of the red, green and blue subpixels SPr, SPg and SPb on the ETL 942, and first and second capping layers 950 and 952 are sequentially disposed in a whole of the red, green and blue subpixels SPr, SPg and SPb on the second cathode 946.

Consequently, in the OLED display device according to the present disclosure, since the triple layered EML of the first EML of the first host and the dopant, the second EML of the second host and the dopant and the third EML of the dopant is formed in the single chamber, the efficiency is improved and the productivity increases.

Further, since the triple layered EML of the first EML of the first host and the dopant, the second EML of the second host and the dopant and the third EML of the second host is formed in the single chamber, the efficiency is improved and the productivity increases.

It will be apparent to those skilled in the art that various modifications and variation can be made in the present disclosure without departing from the scope of the disclosure. Thus, it is intended that the present disclosure cover the modifications and variations of this disclosure provided they come within the scope of the appended claims.

What is claimed is:

1. An organic light emitting diode display device, comprising:
    a substrate having a plurality of subpixels; and
    an emitting material layer in the plurality of subpixels disposed on the substrate,
    wherein the emitting material layer in at least one of the plurality of subpixels comprises:
    a first emitting material layer including a first host and a dopant;
    a second emitting material layer on the first emitting material layer and including a second host and the dopant; and
    a third emitting material layer disposed on the second emitting material layer and including one of the dopant and the second host.

2. The display device of claim 1, wherein a thickness of the third emitting material layer is smaller than a thickness of the second emitting material layer.

3. The display device of claim 1, further comprising a hole blocking layer disposed on the third emitting material layer that includes the dopant,
    wherein an energy level of a lowest unoccupied molecular orbit of the third emitting material layer has a value between an energy level of a lowest unoccupied molecular orbit of the second emitting material layer and an energy level of a lowest unoccupied molecular orbit of the hole blocking layer, and
    wherein an energy level of a highest occupied molecular orbit of the third emitting material layer has a value between an energy level of a highest occupied molecular orbit of the second emitting material layer and an energy level of a highest occupied molecular orbit of the hole blocking layer.

4. The display device of claim 1, wherein the third emitting material layer includes the second host, and the second host has a bipolar type.

5. The display device of claim 1, wherein an energy level of a triplet excited state of the first host of the first emitting material layer is smaller than an energy level of a triplet excited state of the second host of the second emitting material layer.

6. The display device of claim 1, wherein the plurality of subpixels includes red, green and blue subpixels,
    wherein the first host is a first blue host, the dopant is a blue dopant, and the second host is a second blue host,
    wherein the emitting material layers of the red and green subpixels are red and green emitting material layers, respectively, and
    wherein the emitting material layer of the blue subpixel includes a first blue emitting material layer having the first blue host and the blue dopant, a second blue emitting material layer having the second blue host and the blue dopant and a third blue emitting material layer having one of the blue dopant and the second blue host.

7. The display device of claim 1, wherein the plurality of subpixels includes red, green and blue subpixels,
    wherein the first host is a first green host, the dopant is a green dopant, and the second host is a second green host,
    wherein the emitting material layers of the red and blue subpixels are red and blue emitting material layers, respectively, and
    wherein the emitting material layer of the green subpixel includes a first green emitting material layer having the first green host and the green dopant, a second green emitting material layer having the second green host and the green dopant and a third green emitting material layer having one of the green dopant and the second green host.

8. The display device of claim 1, wherein the plurality of subpixels includes red, green and blue subpixels,
    wherein the first host is a first red host, the dopant is a red dopant, and the second host is a second red host,
    wherein the emitting material layers of the green and blue subpixels are green and blue emitting material layers, respectively, and
    wherein the emitting material layer of the red subpixel includes a first red emitting material layer having the first red host and the red dopant, a second red emitting material layer having the second red host and the red dopant and a third red emitting material layer having one of the red dopant and the second red host.

9. The display device of claim 1, wherein the plurality of subpixels includes red, green and blue subpixels, wherein the first host is a first green host and a first blue host, the dopant is a green dopant and a blue dopant, and the second host is a second green host and a second blue host, wherein the emitting material layer of the red subpixel is a red emitting material layer, wherein the emitting material layer of the green subpixel includes a first green emitting material layer having the first green host and the green dopant, a second green emitting material layer having the second green host and the green dopant and a third green emitting material layer having one of the green dopant and the second green host, and wherein the emitting material layer of the blue subpixel includes a first blue emitting material layer having the first blue host and the blue dopant, a second blue emitting material layer having the second blue host and the blue dopant and a third blue emitting material layer having one of the blue dopant and the second blue host.

10. The display device of claim 1, wherein the plurality of subpixels includes red, green and blue subpixels, wherein the first host is a first red host and a first blue host, the dopant is a red dopant and a blue dopant, and the second host is a second red host and a second blue host, wherein the emitting material layer of the green subpixel is a green emitting material layer, wherein the emitting material layer of the red subpixel includes a first red emitting material layer having the first red host and the red dopant, a second red emitting material layer having the second red host and the red dopant and a third red emitting material layer having one of the red dopant and the second red host, and wherein the emitting material layer of the blue subpixel includes a first blue emitting material layer having the first blue host and the blue dopant, a second blue emitting material layer having the second blue host and the blue dopant and a third blue emitting material layer having one of the blue dopant and the second blue host.

11. The display device of claim 1, wherein the plurality of subpixels includes red, green and blue subpixels, wherein the first host is a first red host and a first green host, the dopant is a red dopant and a green dopant, and the second host is a second red host and a second green host, wherein the emitting material layer of the blue subpixel is a blue emitting material layer, wherein the emitting material layer of the red subpixel includes a first red emitting material layer having the first red host and the red dopant, a second red emitting material layer having the second red host and the red dopant and a third red emitting material layer having one of the red dopant and the second red host, and wherein the emitting material layer of the green subpixel includes a first green emitting material layer having the first green host and the green dopant, a second green emitting material layer having the second green host and the green dopant and a third green emitting material layer having one of the green dopant and the second green host.

12. The display device of claim 1, wherein the plurality of subpixels includes red, green and blue subpixels, wherein the first host is a first red host, a first green host and a first blue host, the dopant is a red dopant, a green dopant and a blue dopant, and the second host is a second red host, a second green host and a second blue host, wherein the emitting material layer of the red subpixel includes a first red emitting material layer having the first red host and the red dopant, a second red emitting material layer having the second red host and the red dopant and a third red emitting material layer having one of the red dopant and the second red host, wherein the emitting material layer of the green subpixel includes a first green emitting material layer having the first green host and the green dopant, a second green emitting material layer having the second green host and the green dopant and a third green emitting material layer having one of the green dopant and the second green host, and wherein the emitting material layer of the blue subpixel includes a first blue emitting material layer having the first blue host and the blue dopant, a second blue emitting material layer having the second blue host and the blue dopant and a third blue emitting material layer having one of the blue dopant and the second blue host.

13. The display device of claim 1, wherein the plurality of subpixels includes red, green and blue subpixels and further includes:
- an anode in a whole of the red, green and blue subpixels disposed on the substrate;
- one of a hole injecting layer and a positive type hole transporting layer in a whole of the red, green and blue subpixels disposed on the anode;
- a hole transporting layer in a whole of the red, green and blue subpixels disposed on one of the hole injecting layer and the positive type hole transporting layer;
- red and green hole transporting layers in the red and green subpixels, respectively, disposed on one of the hole injecting layer and the positive type hole transporting layer;
- an electron blocking layer disposed on a whole of the red and green hole transporting layers of the red and green subpixels and the hole transporting layer of the blue subpixel;
- a hole blocking layer disposed on a whole of the emitting material layer of the red, green and blue subpixels;
- an electron transporting layer disposed on a whole of the hole blocking layer of the red, green and blue subpixels;
- first and second cathodes sequentially disposed on a whole of the electron transporting layer of the red, green and blue subpixels; and
- first and second capping layers sequentially disposed on a whole of the second cathode of the red, green and blue subpixels.

14. The display device of claim 1, wherein the plurality of subpixels includes red, green and blue subpixels, and wherein a thickness of the emitting material layer of the green subpixel is greater than a thickness of the emitting material layer of blue subpixel and is smaller than a thickness of the emitting material layer of the red subpixel.

* * * * *